United States Patent
Ji et al.

(10) Patent No.: US 8,605,765 B2
(45) Date of Patent: Dec. 10, 2013

(54) VCSEL WITH SURFACE FILTERING STRUCTURES

(75) Inventors: Chen Ji, San Jose, CA (US); Jingyi Wang, Dublin, CA (US); Laura M. Giovane, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 317 days.

(21) Appl. No.: 12/984,406

(22) Filed: Jan. 4, 2011

(65) Prior Publication Data

US 2012/0170605 A1 Jul. 5, 2012

(51) Int. Cl.
*H01S 5/00* (2006.01)
(52) U.S. Cl.
USPC ............... 372/46.01; 372/50.11; 372/50.124
(58) Field of Classification Search
USPC ............... 372/19, 50.11, 50.124, 46.01
See application file for complete search history.

(56) References Cited

U.S. PATENT DOCUMENTS

| | | | |
|---|---|---|---|
| 4,670,689 A | 6/1987 | Suzuki | |
| 5,778,018 A * | 7/1998 | Yoshikawa et al. | 372/45.01 |
| 5,838,708 A | 11/1998 | Lin et al. | |
| 2004/0161006 A1* | 8/2004 | Chang et al. | 372/45 |
| 2008/0279229 A1* | 11/2008 | Suzuki et al. | 372/19 |
| 2009/0097522 A1* | 4/2009 | Justice et al. | 372/50.11 |
| 2009/0262765 A1 | 10/2009 | Chang et al. | |
| 2010/0029030 A1 | 2/2010 | Uchida et al. | |

OTHER PUBLICATIONS

W. Hofmann, et al., "1.55-um VCSEL With Enhanced Modulation Bandwidth and Temperature Range," Photonics Technology Letters, IEEE, vol. 21, No. 13, pp. 923-925, Jul. 1, 2009.
D. Song, et al., "Single-fundamental-mode photonic-crystal vertical-cavity surface-emitting lasers", Appl. Phys. Letters, AIP, vol. 80, No. 21, pp. 3901-3903, May 27, 2002.

* cited by examiner

*Primary Examiner* — Armando Rodriguez (57) ABSTRACT

Semiconductor devices are described that include a vertical cavity surface emitting laser (VCSEL) and a structure formed on or near the surface of the VCSEL that acts as a filter that benefits high-frequency VCSEL modulation performance.

13 Claims, 9 Drawing Sheets

VCSEL WITH SURFACE FILTERING STRUCTURES

BACKGROUND

Figure 1:
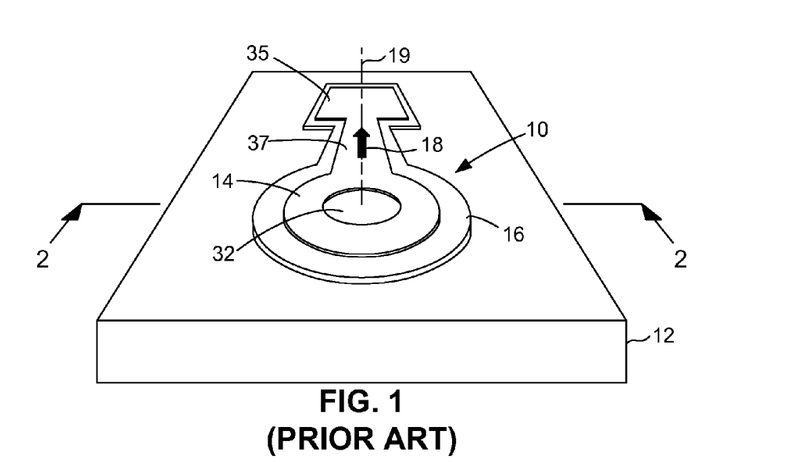
FIG. 1 is a perspective view of a semiconductor device in generalized form, in accordance with the prior art.
Figure 2:
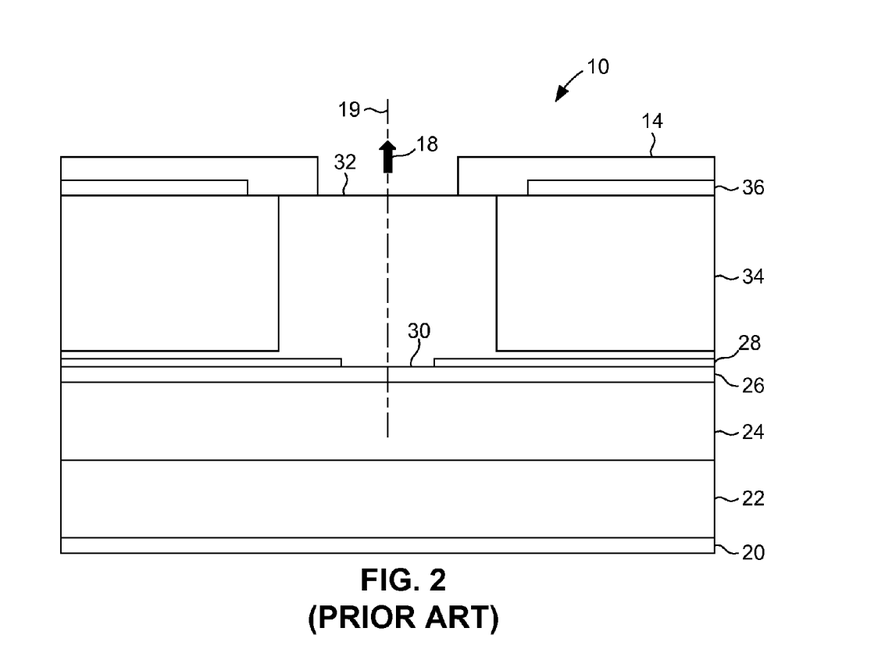
FIG. 2 is a cross-sectional view taken on line 2-2 of FIG. 1, showing the layered structure of the semiconductor device in generalized form.

A vertical cavity surface emitting laser (VCSEL) is a type of semiconductor laser diode in which the optical beam is emitted in a direction normal to the top surface of a generally planar semiconductor structure. As illustrated in FIGS. 1-2, a conventional VCSEL 10 has a structure comprising a stack or number of layers that can be built up using photolithographic techniques. The structure can extend downwardly into a generally planar substrate stack 12, with a portion of the structure extending above the surface of substrate stack 12 including a P-metal layer 14 that is deposited on a raised or mesa region 16 of substrate stack 12. P-metal layer 14 represents the positive (P) electrical contact of the circuit that supplies current to VCSEL 10. P-metal layer 14 has a substantially ring-like or annular shape. In operation, VCSEL 10 emits light through the opening in the center of P-metal layer 14 substantially in the direction of the arrow 18. Note that arrow 18 is aligned along an optical axis 19 of VCSEL 10 that is normal to the planar semiconductor structure.

The remaining layers of the structure have similarly annular or circular shapes that are similarly symmetrically arranged with respect to optical axis 19, though this aspect is not shown in the enlarged cross-sectional view of FIG. 2. The layers are shown in generalized or schematic form in FIG. 2 for purposes of clarity. Also note that FIGS. 1-2 are not to scale. At the bottom of the structure, an N-metal layer 20 is deposited over a semiconductor (e.g., GaAs) substrate layer 22. N-metal layer 20 represents the negative (N) electrical contact of the circuit that supplies current to VCSEL 10. Above substrate layer 22 is an N-type lower distributed Bragg reflector (N-DBR) layer 24. Above N-DBR layer 24 is an active region 26 that can comprise one or more quantum wells. Above active region 26 is an oxide layer 28 having an annular shape that defines an oxide aperture 30. A P-type upper distributed Bragg reflector (P-DBR) layer 32 is disposed above oxide layer 28 and extends into oxide aperture 30. Oxide layer 28 helps direct electrical charge into active region 26. N-DBR layer 24 is sometimes referred to as the lower DBR of the VCSEL, and P-DBR layer 32 is sometimes referred to as the upper DBR of the VCSEL. An isolation implant layer 34 surrounds the periphery of P-DBR layer 32. Isolation implant layer 34 can be formed of P-DBR material in which ions are implanted to make the layer dielectric, so as to electrically insulate P-metal layer 14 from active region 26. A dielectric layer 36 between isolation implant layer 34 and P-metal layer 14 provides further electrical insulation. When a voltage is applied between P-metal layer 14 and N-metal layer 20, a current flows downwardly from P-metal layer 14 toward active region 26, causing photons to be emitted in the area of active region 26 within oxide aperture 30. The voltage is applied by coupling a source of high frequency electrical energy between a bondpad 35 and N-metal layer 20. A metal neck region 37 electrically connects bondpad 35 to P-metal layer 14.

The VCSEL described above is only one of several types known in the art. For example, in another common VCSEL configuration (not shown) the N-metal layer is on the top surface. A well can be etched beyond the active region, exposing the N-DBR region or N-type substrate, and the N-metal layer can be deposited over and in the well.

A VCSEL of the type described above can be modulated at high speeds (i.e., radio frequencies or RF) and used in a high-bandwidth optical data communication link. However, the modulation bandwidth is limited by several effects, including intrinsic properties of the optical-electrical conversion process, thermal effects, and electrical parasitic effects. The first of these effects relates to the VCSEL response rolling off as the VCSEL is driven above its resonant frequency. The second of these effects relates to the VCSEL response rolling off with an increase in temperature. The third effect relates to parasitic capacitances and inductances in the VCSEL that can cause frequency-dependent power transfer rolloff between the RF source and the VCSEL junction.

SUMMARY

Embodiments of the present invention relate to semiconductor devices that include a vertical cavity surface emitting laser (VCSEL) and a structure formed on or near the surface of the VCSEL that acts as a filter to promote good high-frequency VCSEL modulation performance.

In one aspect, a filter structure can comprise a pattern formed in a substantially annular region of one of the layers of materials forming the VCSEL. In another aspect, a filter structure can comprise a Schottky region in contact with the VCSEL electrical contact layer. In still another aspect, a filter structure can be formed on or near the surface of the semiconductor substrate on which the VCSEL is formed and be coupled between the VCSEL electrical contact layer and a bondpad.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 3:
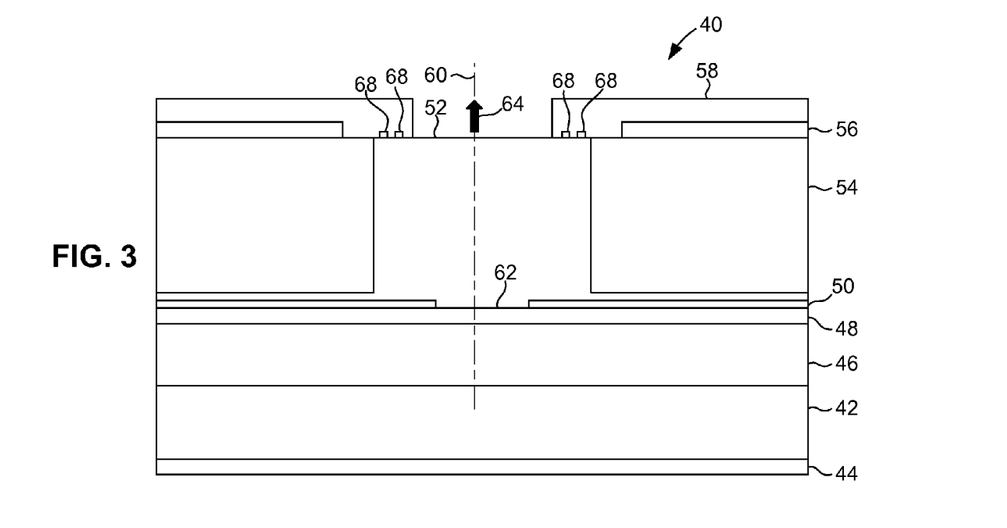
FIG. 3 is a cross-sectional view similar to FIG. 2 but of a semiconductor device in accordance with an exemplary embodiment of the invention, in which the filter structure comprises a pattern formed in a VCSEL layer.
Figure 4:
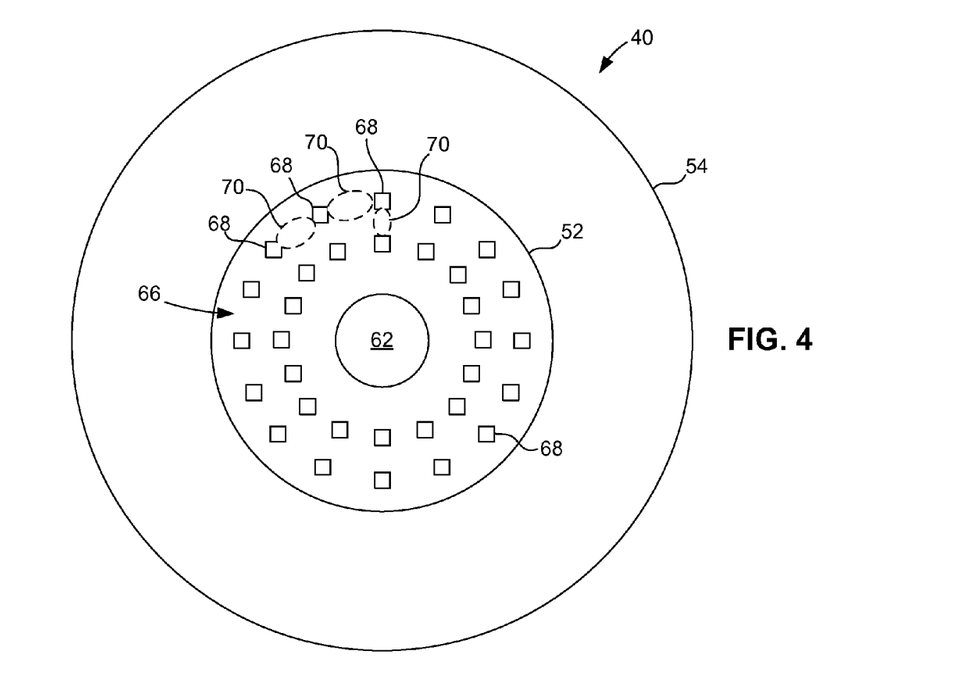
FIG. 4 is a top plan view of the semiconductor device of FIG. 3, with the top metal contact layer and dielectric layer removed to show the patterned filter structure.

As illustrated in FIGS. 3-4, in an illustrative or exemplary embodiment of the invention, a VCSEL 40 has a structure comprising a number of layers, including a semiconductor substrate 42. The remaining layers are formed around semiconductor substrate 42 and include an N-metal layer 44 below substrate 42, an N-type distributed Bragg reflector (N-DBR) layer 46 above substrate 42, an active region 48 above N-DBR layer 46, an oxide layer 50 above active region 48, a P-type distributed Bragg reflector (P-DBR) layer 52 above oxide layer 50, an isolation implant layer 54 around the periphery of P-DBR layer 52, a dielectric layer 56 above isolation implant layer 54, and a P-metal layer 58 above dielectric layer 56. Additional layers can be included in other embodiments, such as a narrow layer of P-DBR material between active region 48 and oxide layer 50. The above-referenced layered structure can be formed by conventional photolithographic techniques, as well understood by persons skilled in the art to which the invention relates. But for substrate 42, each of the layers can have a substantially circular or annular shape, symmetrically arranged with respect to an optical axis 60. For example, the annular shape of oxide layer 50 defines an oxide aperture 62. The references herein to "above" or "below" are with respect to optical axis 60 and the direction in which VCSEL 40 emits light in operation. N-metal layer 44 defines the bottom surface of VCSEL 40. P-metal layer 58 defines the upper surface of VCSEL 40. In operation, VCSEL 40 generates light within active region 48 in response to an electrical charge applied through P-metal layer 58 and N-metal layer 44. The light is emitted through an opening in the center of P-metal layer 58 in a direction above the upper surface of VCSEL 40, as indicated by the arrow 64. Note that the above-described layers are shown in generalized or schematic form in FIG. 2 for purposes of clarity. Also note that neither FIGS. 3-4 nor any other drawing figures herein are to scale.

In the embodiment illustrated in FIGS. 3-4, a pattern 66 between P-metal layer 58 and P-DBR layer 52 acts as a filter to promote good high-frequency modulation performance of VCSEL 40 in operation. The term "pattern" as used herein refers to a repeating (e.g., geometric) shape or similar feature that is repeated at regular or substantially regular intervals. For example, pattern 66 can comprise a multiplicity of dielectric formations 68, such as cuboid masses (FIG. 4), distributed substantially evenly in a ring or annular region around optical axis 60. Although as illustrated in FIG. 4 each formation 68 can have, for example, a substantially square shape, in other embodiments such masses or other formations can have any other suitable shape, such as a drop-like shape, a dot-like shape, etc. Each formation 68 can have, for example, a square shape measuring between about one to two micrometers on each side and a thickness or depth in the range of, for example, a few hundred angstroms to about 1,000 angstroms. The region in which dielectric formations 68 are distributed extends substantially continuously around optical axis 60 but for the interstitial spaces 70 between adjacent dielectric formations 68. In this embodiment, portions of P-metal layer 58 extend (e.g., a few hundred angstroms) into interstitial spaces 70 and contact P-DBR layer 52. Thus, pattern 66 is defined or characterized by alternating regions of dielectric material (i.e., dielectric formations 68) and conductive material (i.e., portions of P-metal layer 58). Pattern 66 can also be characterized as a pattern or texture in the bottom surface of P-metal layer 58, since dielectric formations 68 extend or protrude (e.g., a few hundred angstroms) into P-metal layer 58 in this embodiment. Interstitial spaces 70 can be on the same order of size as dielectric formations 68, such as one to two micrometers. Pattern 66 can be formed through photolithographic techniques, such as, for example, depositing bump-like masses, drops, dots, etc., of a dielectric material on the surface of P-DBR layer 52 and then forming P-metal layer 58 over these dielectric masses.

Although in the exemplary embodiment, pattern 66 comprises a multiplicity of bump-like or cube-like dielectric formations 68 that are distributed substantially evenly in a ring or annular region around optical axis 60, in other embodiments such a pattern can instead comprise, for example, a grid-like or cross-hatch pattern of dielectric material, or two or more concentric rings of dielectric material.

In operation, as pattern 66 has an annular shape, light emitted from active region 48 is not impeded by pattern 66 from being emitted from the surface of VCSEL 40 through the opening in P-metal layer 58. Note that FIG. 4 illustrates VCSEL 40 with P-metal layer 58 and dielectric layer 56 omitted so that pattern 66 can be seen.

Figure 5:
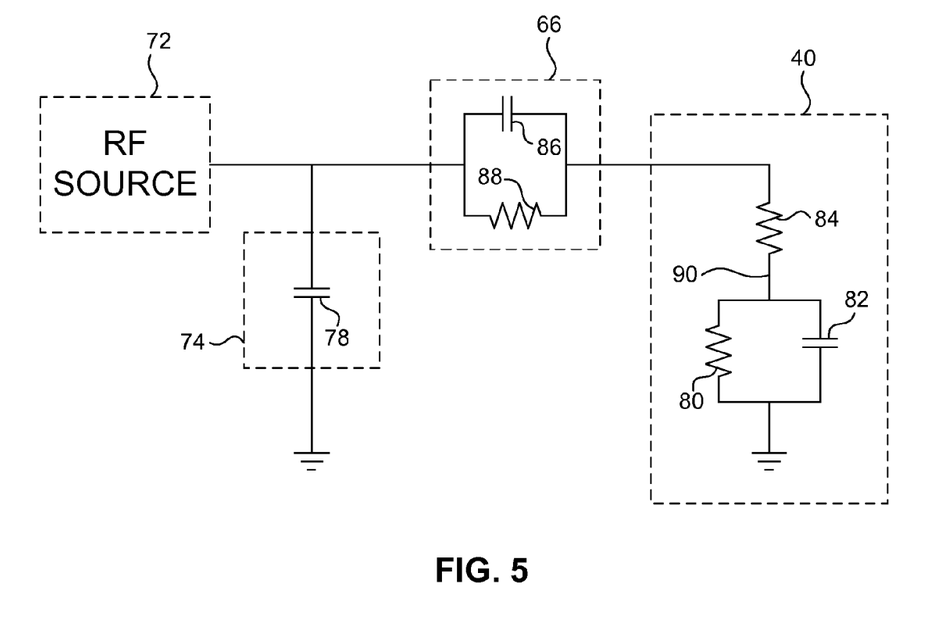
FIG. 5 is a circuit diagram illustrating a circuit model of the semiconductor device of FIGS. 3-4.

As illustrated in FIG. 5, which electrically models the semiconductor structure of FIGS. 3-4, pattern 66 acts as a filter between VCSEL 40 and a source of RF electrical energy 72 that is coupled to a bondpad 74. Although not shown in FIGS. 3-4 for purposes of clarity, bondpad 74 is similar to bondpad 35 shown in FIG. 1 and is similarly electrically connected to P-metal layer 58 by a metal neck region. Bondpad 74 exhibits a parasitic capacitance 78. VCSEL 40 exhibits a parasitic junction resistance 80, a parasitic junction capacitance 82 in parallel with junction resistance 80, and a parasitic series resistance 84 in series with the parallel combination of junction resistance 80 and junction capacitance 82. Pattern 66, as it exists as part of the structure shown in FIGS. 3-4, exhibits a filter capacitance 86 in parallel with a filter resistance 88, thereby defining a high-pass filter. Pattern 66, acting as a high-pass filter, can selectively promote good high frequency modulation response of VCSEL 40 at the junction voltage of VCSEL 40 that is present at the VCSEL junction 90 in operation. Note that VCSEL junction 90 in FIG. 5 electrically represents the diode junction that is formed at active region 48 between P-DBR layer 52 and N-DBR layer 46.

Figure 6:
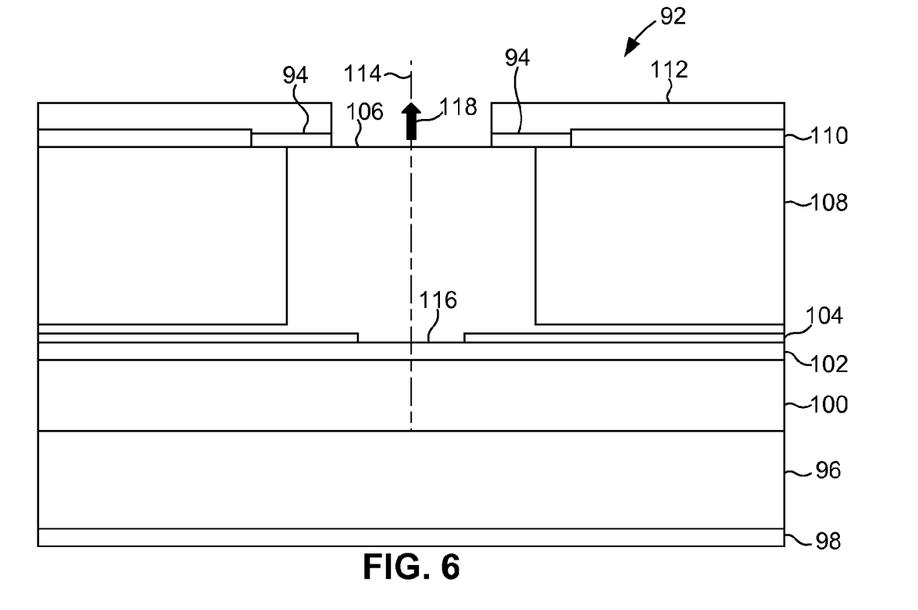
FIG. 6 is a cross-sectional view similar to FIGS. 2 and 3 but of a semiconductor device in accordance with another exemplary embodiment of the invention, in which the filter structure comprises a metallic Schottky layer.

As illustrated in FIG. 6, in another exemplary embodiment of the invention, a VCSEL 92 has a structure similar to that described above but includes a Schottky layer 94 instead of pattern 66. Thus, VCSEL 92 includes a semiconductor substrate 96, an N-metal layer 98 below substrate 96, an N-DBR layer 100 above substrate 96, an active region 102 above N-DBR layer 100, an oxide layer 104 above active region 102, a P-DBR layer 106 above oxide layer 104, an isolation implant layer 108 around the periphery of P-DBR layer 106, a dielectric layer 110 above isolation implant layer 108, and a P-metal layer 112 above dielectric layer 110. As in the embodiment described above with regard to FIGS. 3-4, each of the layers can have a substantially circular or annular shape, symmetrically arranged with respect to an optical axis 114. For example, the annular shape of oxide layer 104 defines an oxide aperture 116. In operation, VCSEL 92 generates light within active region 102 in response to an electrical charge applied through P-metal layer 112 and N-metal layer 98. The light is emitted through an opening in the center of P-metal layer 112 in a direction extending above the upper surface of VCSEL 92, as indicated by the arrow 118.

In the embodiment illustrated in FIG. 6, Schottky layer 94 between P-metal layer 112 and P-DBR layer 106 acts as a filter to promote good high-frequency modulation performance of VCSEL 92 in operation. Although Schottky layer 94 can be made of any suitable material, in the embodiment shown in FIG. 6 Schottky layer 94 is made of metal. For example, Schottky layer 94 can be similar to P-metal layer 112 but metallurgically altered to provide a Schottky contact rather than an ohmic contact with P-DBR layer 106. As well understood in the art, in a general sense the term "Schottky" or "Schottky diode" refers to a contact region between two materials that acts like a diode junction with a forward voltage drop that is very low but greater than zero, such as, for example, 0.15 to 0.45 volts. A Schottky contact can be contrasted with an ohmic contact, which exhibits no diode-like behavior and effectively zero voltage drop. For example, the electrical contact between P-metal layer 14 and P-DBR layer 32 in VCSEL 10 described above with regard to FIG. 2 is an ohmic contact. In the conventional VCSEL 10 shown in FIG. 2, ohmic contact between P-metal layer 14 and P-DBR layer 32 is desirable because it maximizes the transfer of electrical energy. However, in accordance with the present invention it has been found that Schottky contact between P-metal layer 112 and P-DBR layer 106 can provide a useful filter effect. Like P-metal layer 112, Schottky layer 94 has an annular shape and thus does not impede the emission of light during operation.

Figure 7:
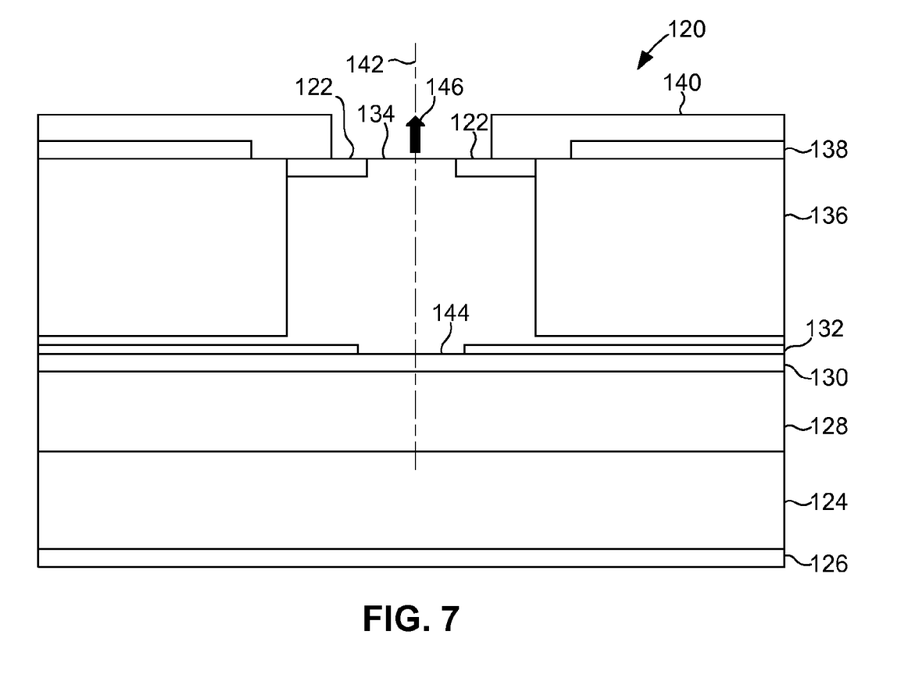
FIG. 7 is a cross-sectional view similar to FIGS. 2, 3 and 6 but of a semiconductor device in accordance with still another exemplary embodiment of the invention, in which the filter structure comprises a semiconductor Schottky layer.

As illustrated in FIG. 7, in yet another exemplary embodiment of the invention, a VCSEL 120 has a structure similar to that described above with regard to FIG. 6 but includes another type of Schottky layer 122. Thus, VCSEL 120 includes a semiconductor substrate 124, an N-metal layer 126 below substrate 124, an N-DBR layer 128 above substrate 124, an active region 130 above N-DBR layer 128, an oxide layer 132 above active region 130, a P-DBR layer 134 above oxide layer 132, an isolation implant layer 136 around the periphery of P-DBR layer 134, a dielectric layer 138 above isolation implant layer 136, and a P-metal layer 140 above dielectric layer 138. As in the embodiment described above with regard to FIG. 6, each of the layers can have a substantially circular or annular shape, symmetrically arranged with respect to an optical axis 142. For example, the annular shape of oxide layer 132 defines an oxide aperture 144. In operation, VCSEL 120 generates light within active region 130 in response to an electrical charge applied through P-metal layer 140 and N-metal layer 126. The light is emitted through an opening in the center of P-metal layer 140 in a direction above the upper surface of VCSEL 120, as indicated by the arrow 146. Like P-metal layer 112, Schottky layer 94 has an annular shape and thus does not impede the emission of light during operation.

In the embodiment illustrated in FIG. 7, Schottky layer 122 between P-metal layer 140 and P-DBR layer 134, acts as a filter to promote good high-frequency modulation performance of VCSEL 120 in operation. Schottky layer 122 can be made of a doped semiconductor material. For example, Schottky layer 122 can be similar to P-DBR layer 134 but doped more lightly to provide a Schottky contact rather than an ohmic contact with P-metal layer 140. As well understood in the art, high semiconductor surface doping (e.g., greater than, for example, 5e18 atoms per $cm^3$) is used to provide an ohmic contact or interface between a P-DBR layer and P-metal layer in the conventional VCSEL 10 shown in FIG. 2. In contrast, to provide a Schottky contact the doping level should be less than about 5e17 atoms per $cm^3$. Nevertheless, a contact can be sufficiently Schottky to provide an effect in accordance with an embodiment of the present invention even if the doping level is somewhat greater than 5e17 atoms per $cm^3$.

Figure 8:
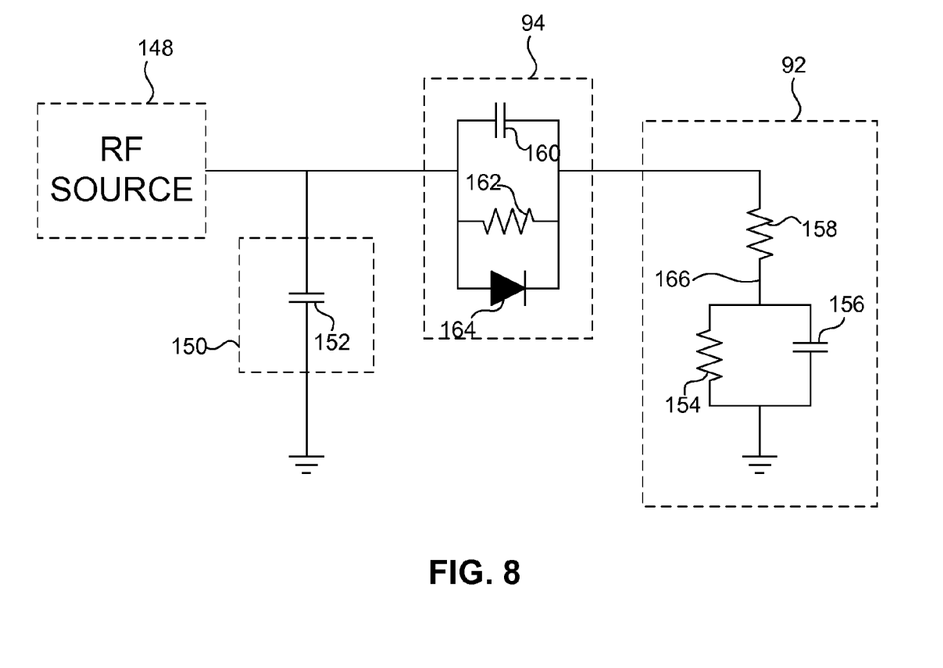
FIG. 8 is a circuit diagram illustrating a circuit model of the semiconductor device of FIGS. 6-7.

As illustrated in FIG. 8, Schottky layer 94 in the embodiment shown in FIG. 6 (or Schottky layer 122 in the embodiment shown in FIG. 7) acts as a filter between VCSEL 92 (or VCSEL 120 in the embodiment shown in FIG. 7) and a source of RF electrical energy 148 that is coupled to a bondpad 150. Although not shown in FIG. 8 or 9 for purposes of clarity, bondpad 150 is similar to bondpad 35 shown in FIG. 1 and is similarly electrically connected to P-metal layer 112 (or P-metal layer 140 in the embodiment shown in FIG. 7) by a metal neck region. Bondpad 150 exhibits a parasitic capacitance 152. VCSEL 92 (or VCSEL 120 in the embodiment shown in FIG. 7) exhibits a parasitic junction resistance 154, a parasitic junction capacitance 156 in parallel with junction resistance 154, and a parasitic series resistance 158 in series with the parallel combination of junction resistance 154 and junction capacitance 156. Schottky layer 94 (or Schottky layer 122 in the embodiment shown in FIG. 7), as it exists as part of the structure shown in FIG. 6 (or FIG. 7), exhibits a filter capacitance 160, a filter resistance 162, and a Schottky diode characteristic 164 in parallel with each other over a relatively low frequency range. Above this frequency range, in the high frequency range of the signal provided by RF source 148, the Schottky diode characteristic 164 drops out or becomes of negligible effect, and Schottky layer 94 (or Schottky layer 122 in the embodiment shown in FIG. 7) effectively becomes a high-pass filter like that described above with regard to pattern 66 in the embodiment shown in FIG. 5. Schottky layer 94 (or Schottky layer 122 in the embodiment shown in FIG. 7), acting as a high-pass filter, can selectively promote good high frequency modulation response of VCSEL 92 (or VCSEL 120 in the embodiment shown in FIG. 7) at the junction voltage of VCSEL 92 (or VCSEL 120) that is present at the VCSEL junction 166 in operation.

Although in the embodiments illustrated in FIGS. 6-7, VCSELs 92 and 120 have Schottky layers 94 and 122, respectively, instead of a pattern, it should be understood that in still further embodiments that are similar to that illustrated in FIGS. 3-4 the pattern itself can provide Schottky contact between the P-metal layer and P-DBR layer. That is, the Schottky layer can have a pattern.

Figure 9:
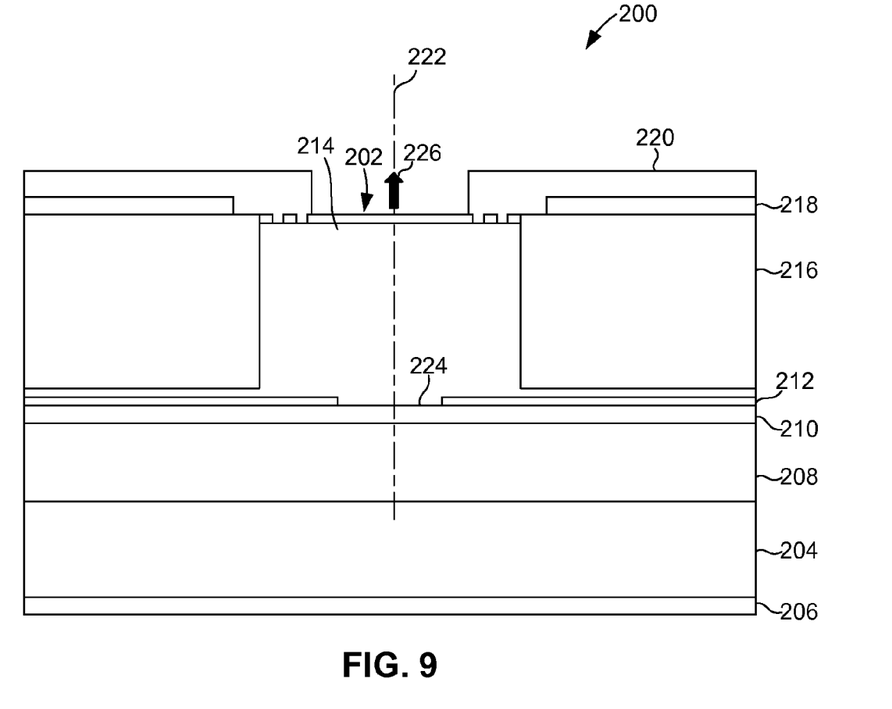
FIG. 9 is a cross-sectional view similar to FIGS. 2, 3, 6 and 7 but of a semiconductor device in accordance with yet another exemplary embodiment of the invention, in which the filter structure comprises a semiconductor Schottky layer.

For example, as illustrated in FIG. 9, a VCSEL 200 has a structure similar to that described above with regard to FIGS. 6-7 but includes still another type of Schottky layer 202. Accordingly, VCSEL 200 includes a semiconductor substrate 204, an N-metal layer 206 below substrate 204, an N-DBR layer 208 above substrate 204, an active region 210 above N-DBR layer 208, an oxide layer 212 above active region 210, a P-DBR layer 214 above oxide layer 212, an isolation implant layer 216 around the periphery of P-DBR layer 214, a dielectric layer 218 above isolation implant layer 216, and a P-metal layer 220 above dielectric layer 218. As in the embodiments described above with regard to FIGS. 6-7, each of the layers can have a substantially circular or annular shape, symmetrically arranged with respect to an optical axis 222. For example, the annular shape of oxide layer 212 defines an oxide aperture 224. In operation, VCSEL 200 generates light within active region 210 in response to an electrical charge applied through P-metal layer 220 and N-metal layer 206. The light is emitted through an opening in the center of P-metal layer 220 in a direction above the upper surface of VCSEL 200, as indicated by the arrow 226. Schottky layer 202 can be made of a material similar to P-DBR layer 214 but having a different doping level. Schottky layer 202 can be formed either by surface-etching a pattern in the material or by evaporation of a portion of P-metal layer 220, resulting in a pattern of alternating regions of Schottky contact and resistive contact between P-metal layer 220 and P-DBR layer 214 similar to the pattern shown in FIG. 4. As the material of Schottky layer 202 is transparent to the emitted light, it does not impede the emission of light during operation.

Figure 10:
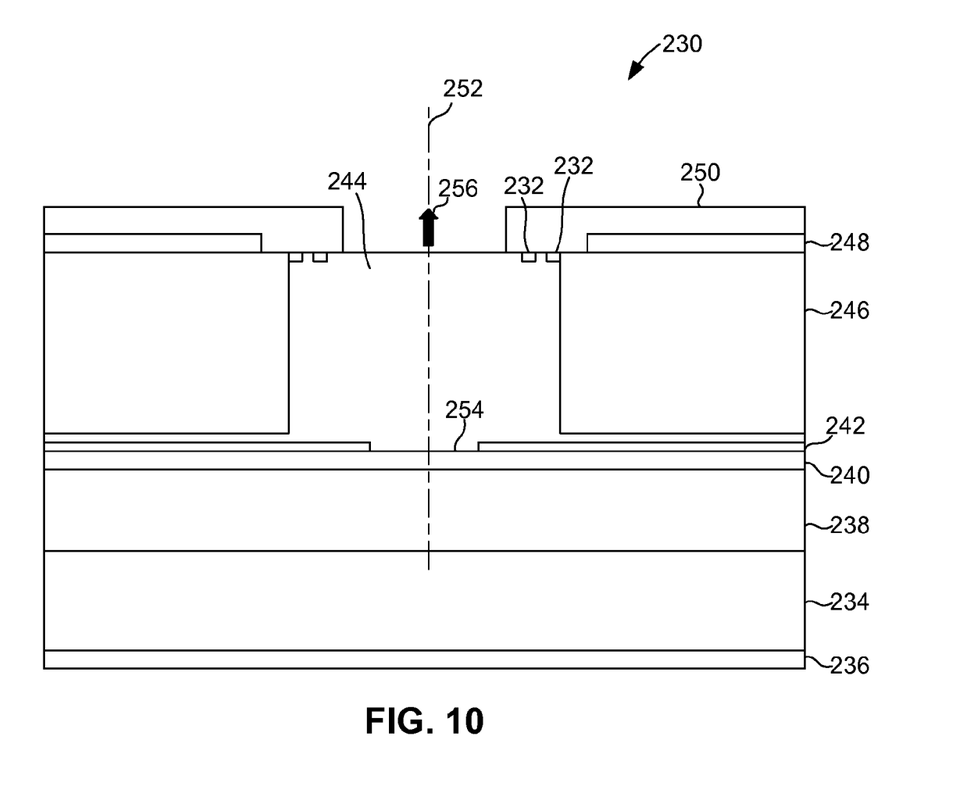
FIG. 10 is a cross-sectional view similar to FIGS. 2, 3, 6, 7 and 9 but of a semiconductor device in accordance with yet another exemplary embodiment of the invention, in which the filter structure comprises a semiconductor Schottky layer.
Figure 11:
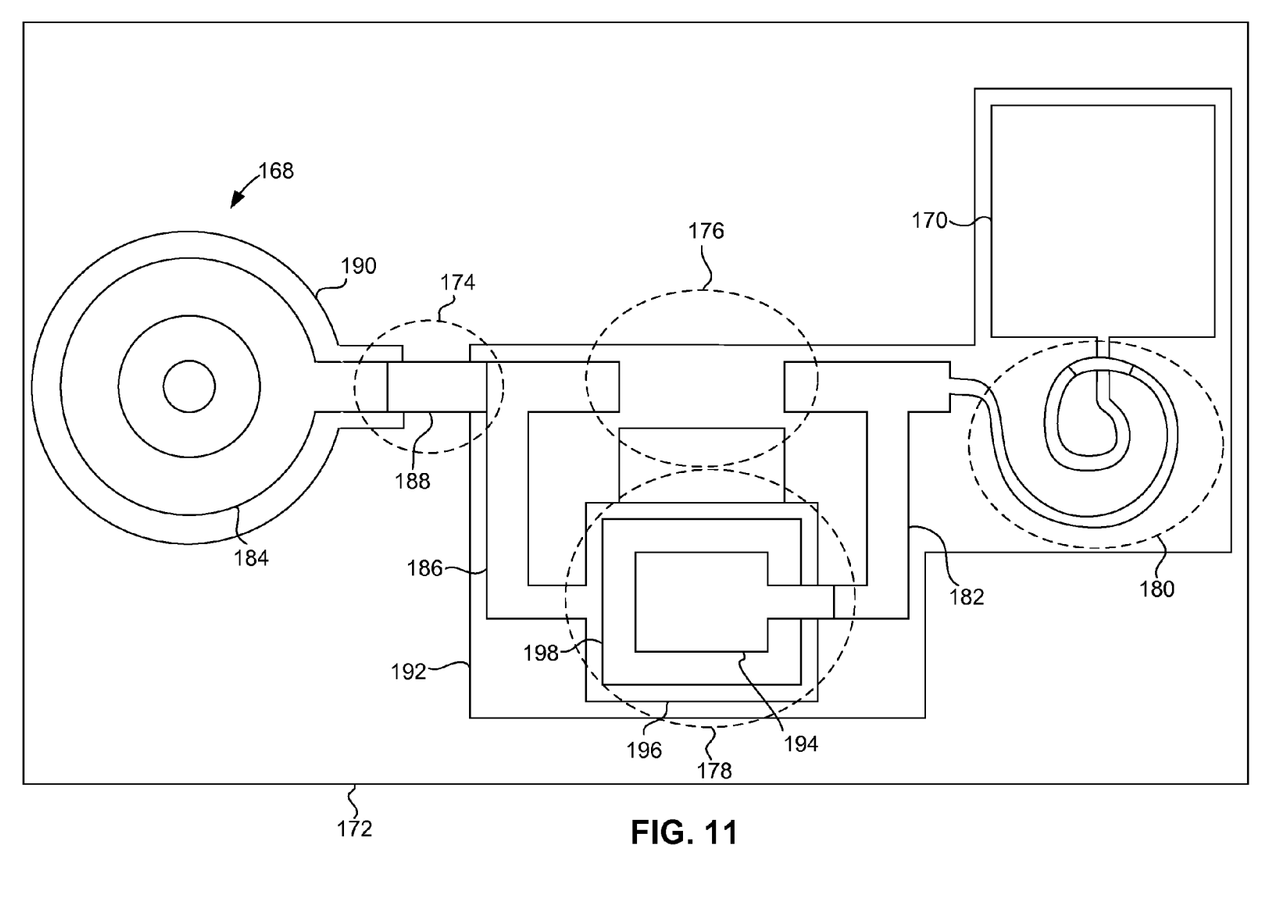
FIG. 11 is a top plan view of a semiconductor device in accordance with yet another exemplary embodiment of the invention, in which filter structures are formed on the surface of the VCSEL substrate.

As illustrated in FIG. 10, in an exemplary embodiment similar to that described above with regard to FIG. 9, a VCSEL 230 includes another type of Schottky layer 232, as well as a semiconductor substrate 234, an N-metal layer 236 below substrate 234, an N-DBR layer 238 above substrate 234, an active region 240 above N-DBR layer 238, an oxide layer 242 above active region 240, a P-DBR layer 244 above oxide layer 242, an isolation implant layer 246 around the periphery of P-DBR layer 244, a dielectric layer 248 above isolation implant layer 246, and a P-metal layer 250 above dielectric layer 248. As in the embodiments described above with regard to FIGS. 6-7 and 9, each of the layers can have a substantially circular or annular shape, symmetrically arranged with respect to an optical axis 252. For example, the annular shape of oxide layer 242 defines an oxide aperture 254. In operation, VCSEL 230 generates light within active region 240 in response to an electrical charge applied through P-metal layer 250 and N-metal layer 236. The light is emitted through an opening in the center of P-metal layer 250 in a direction above the upper surface of VCSEL 230, as indicated by the arrow 256. Schottky layer 232 can be formed of ion-implanted regions of the surface (e.g., a few hundred to about 1,000 angstroms in depth) of P-DBR layer 244 that alternate with non-ion-implanted regions of P-DBR layer 244 in a pattern similar to that shown in FIG. 4.

As illustrated in FIGS. 11-14, in still other exemplary embodiments of the invention, a VCSEL 168 having a structure similar to those described above can be part of a semiconductor device that includes a metal bondpad 170 and one or more of the following filter elements or a similar filter element formed on the surface of the semiconductor substrate stack 172: a metal airbridge 174, an etched semiconductor bridge 176, a surface capacitor 178, and a metal coil 180. Each of these filter elements is a two-terminal device having a first terminal or node coupled to bondpad 170 (via zero or more other such filter elements or via portions of a neck region 182 or 186) and a second terminal or node coupled to the P-metal layer 184 of VCSEL 168 (via zero or more other such filter elements or via portions of neck regions 182 and 186).

Figure 12:
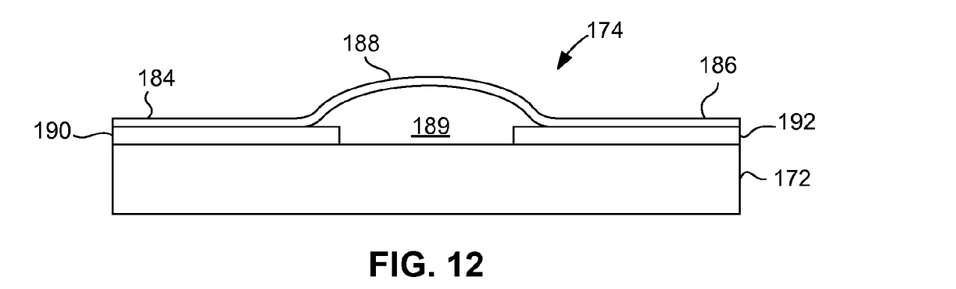
FIG. 12 is a side elevational view showing a portion of FIG. 11.

Metal airbridge 174, which is further illustrated in a side view in FIG. 12, comprises a metal bridge portion 188 that extends over a gap 189, i.e., through the air, between a raised or mesa region 190 of the upper surface of substrate stack 172 around VCSEL 168 and a similar mesa region 192 on another area on the surface of substrate stack 172. Mesa region 192 is raised above the remainder of substrate stack 172 in a manner similar to that illustrated in FIG. 1. Such metal airbridges are, in and of themselves, known in the art, and are conventionally used to provide inductance. As persons skilled in the art understand how to form such airbridges, the formation and structure of metal airbridge 174 are not described herein in further detail. In accordance with the present invention, metal airbridge 174 can serve as an inductor between bondpad 170 and P-metal layer 184. In a manner similar to the various filters described above with regard to the embodiments shown in FIGS. 3-8, metal airbridge 174 can serve as a high-pass filter that selectively promotes good high frequency modulation response of VCSEL 168 at the junction voltage in operation. As noted above, metal airbridge 174 can be included in combination with one or more of the other filter elements shown in FIGS. 11-14 or as the sole filter element.

Figure 13:
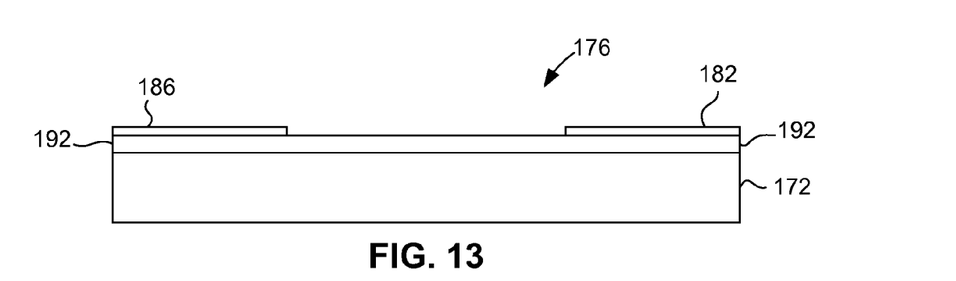
FIG. 13 is a side elevational view showing another portion of FIG. 11.

Etched semiconductor bridge 176, which is further illustrated in a side view in FIG. 13, exhibits a resistance and can be used in combination with others of the filter elements shown in FIGS. 11-14 to define additional filter elements. For example, the combination of etched semiconductor bridge 176 in parallel with surface capacitor 178 can exhibit a filter capacitance in parallel with a filter resistance, similar to filter capacitance 86 and filter resistance 88 shown in FIG. 5.

Figure 14:
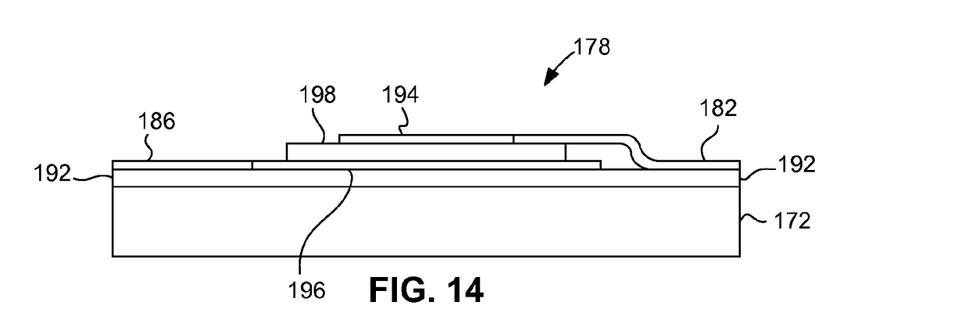
FIG. 14 is a side elevational view showing still another portion of FIG. 11.

As illustrated in FIG. 14, surface capacitor 178 can comprise a top metal planar region 194 coupled to a portion of neck region 186, a bottom metal planar region 196 coupled to a portion of neck region 182, and a dielectric layer 198 between top and bottom metal planar regions 194 and 196. Such surface capacitors are, in and of themselves, well known in the art. As persons skilled in the art understand how to form such surface capacitors, the formation and structure of surface capacitor 178 are not described herein in further detail. Surface capacitor 178 can serve as a capacitance between bondpad 170 and P-metal layer 184. In a manner similar to the various filters described above, surface capacitor 178, either alone or in combination with etched semiconductor bridge 176 or others of the filter elements described herein, can serve as a high-pass filter that selectively promotes good high frequency modulation response of VCSEL 168 at the junction voltage in operation.

Metal coil 180, which exhibits an inductance, can similarly be used alone or in combination with others of the filter elements described herein. Such metal coils formed on the surface of a semiconductor substrate are, in and of themselves, well known and used to provide an inductance. As persons skilled in the art understand how to form such metal coils, the formation and structure of metal coil 180 are not described herein in further detail. In accordance with the present invention, metal coil 180 can serve as an inductor between bondpad 170 and P-metal layer 184. In a manner similar to the various filters described above, metal coil 180 can serve as a high-pass filter that selectively promotes good high frequency modulation response of VCSEL 168 at the junction voltage in operation. As noted above, metal coil 180 can be included in combination with one or more of the other filter elements shown in FIGS. 11-14 or as the sole filter element.

Metal airbridge 174, etched semiconductor bridge 176, surface capacitor 178, metal coil 180, and combinations thereof, are intended only as examples of filter elements that can be formed on the surface of a semiconductor substrate stack and coupled between a bondpad and a VCSEL P-metal contact. In view of these examples and other teachings herein, still other suitable types of filter elements that can be formed on the surface of a semiconductor substrate stack and coupled between a bondpad and a VCSEL P-metal contact will occur readily to persons skilled in the art and are therefore within the scope of the invention.

More generally, one or more illustrative embodiments of the invention have been described above. However, it is to be understood that the invention is defined by the appended claims and is not limited to the specific embodiments described.

What is claimed is:

1. A semiconductor device, comprising:
   a vertical cavity surface emitting laser (VCSEL) comprising a semiconductor substrate and a plurality of layers, the plurality of layers including a light-generating active region, an N-type distributed Bragg reflector (N-DBR) layer above the substrate, a P-type DBR (P-DBR) layer above the N-DBR layer, and a metal electrical contact layer above the P-DBR layer, the metal electrical contact layer having an optical opening, the active region generating light in response to an injected electrical charge, the generated light directed through the optical opening in a direction substantially along a central optical axis normal to a plane of the substrate; and
   a pattern formed in an annular region in a layer between the metal electrical contact layer and the P-DBR layer, the pattern extending in the annular region substantially continuously around the central optical axis outside the optical opening and directly beneath the metal electrical contact layer.

2. The semiconductor device claimed in claim 1, wherein the layer having the pattern formed therein is a dielectric layer and comprises alternating regions of dielectric material and non-dielectric material.

3. The semiconductor device claimed in claim 2, wherein the non-dielectric material comprises portions of the metal electrical contact layer extending into interstitial spaces in the pattern and contacting the P-DBR layer.

4. The semiconductor device claimed in claim 1, wherein the pattern comprises a multiplicity of dielectric formations substantially evenly distributed in the annular region.

5. The semiconductor device claimed in claim 1, wherein the layer of layer having the pattern formed therein includes alternating regions of direct ohmic contact between the P-DBR layer and the metal electrical contact layer and regions of doped semiconductor material, the regions of doped semiconductor material being disposed in the layer between the metal electrical contact layer and the P-DBR layer and doped differently from the P-DBR layer.

6. The semiconductor device claimed in claim 5, wherein the pattern comprises a multiplicity of regions of doped semiconductor material substantially evenly distributed in the annular region.

7. The semiconductor device claimed in claim 1, wherein the pattern comprises a layer of alternating regions of ion-implanted material and non-implanted material.

8. The semiconductor device claimed in claim 7, wherein the pattern comprises a multiplicity of regions of ion-implanted material substantially evenly distributed in the annular region.

9. A semiconductor device, comprising:
   a vertical cavity surface emitting laser (VCSEL) comprising a semiconductor substrate and a plurality of layers, the plurality of layers including a light-generating active region and a metal electrical contact layer having an optical opening, the active region generating light in a direction substantially along a central optical axis through the optical opening in response to an injected electrical charge; and
   a Schottky layer formed in an annular region outside the optical opening and directly beneath and in contact with the metal electrical contact layer.

10. The semiconductor device claimed in claim 9, wherein the Schottky layer has a pattern.

11. The semiconductor device claimed in claim 9, wherein:
    the VCSEL includes an N-type distributed Bragg reflector (N-DBR) layer above the substrate, a P-type DBR (P-DBR) layer above the N-DBR layer, a metal contact layer above the P-DBR layer, and a dielectric layer between the metal electrical contact layer and the P-DBR layer; and
    the Schottky layer is disposed between the P-DBR layer and the metal electrical contact layer and electrically coupling the P-DBR layer to the metal layer.

12. The semiconductor device claimed in claim 11, wherein the Schottky layer comprises a metallic material.

13. The semiconductor device claimed in claim 11, wherein the Schottky layer comprises a semiconductor material.

* * * * *